United States Patent [19]

Kahn

[11] Patent Number: 4,769,842

[45] Date of Patent: Sep. 6, 1988

[54] ASYMMETRICAL SIDEBAND TRANSMISSION WITH PSEUDO-STEREO EFFECTS

[76] Inventor: Leonard R. Kahn, 137 E. 36th St., New York, N.Y. 10016

[21] Appl. No.: 91,569

[22] Filed: Aug. 31, 1987

[51] Int. Cl.[4] .................... H03G 3/00

[52] U.S. Cl. .................... 381/16; 455/61

[58] Field of Search .................... 381/2, 3, 4, 14, 15, 381/16; 455/61, 102, 103, 108

[56] References Cited

U.S. PATENT DOCUMENTS 4,569,073 2/1986 Kahn .................... 381/16

*Primary Examiner*—Forester W. Isen

*Attorney, Agent, or Firm*—E. A. Onders

[57] ABSTRACT

An improved asymmetrical sideband amplitude modulation (AM) transmitter is provided wherein the resulting transmitted signal produces a pleasing pseudo-stereo effect when received by a stereo receiver of the type designed to receive symmetrical sideband, phase-separated AM stereo radio braodcasts, when such receiver is operating in its stereo mode.

6 Claims, 1 Drawing Sheet

ASYMMETRICAL SIDEBAND TRANSMISSION WITH PSEUDO-STEREO EFFECTS

FIELD OF THE INVENTION

The present invention relates to amplitude modulation (AM) radio broadcast transmitters.

BACKGROUND OF THE INVENTION

The present invention is an improvement of the invention covered by my prior U.S. Pat. No. 4,569,073 entitled "Asymmetrical Sideband Transmission", which issued on Feb. 4, 1986.

My prior patent discloses and claims a method and apparatus for transmitting an AM carrier wave with asymmetrical sidebands. That is, where one sideband is made to intentionally have a higher amplitude level than the other sideband. The transmitted signal is unique in that when it is received by a conventional monophonic AM broadcast radio receiver having an envelope detector, it produces pleasing sound when the receiver is detuned off the carrier frequency to favor the stronger sideband. The resulting benefits and advantages are fully described in my prior U.S. Pat. No. 4,569,073.

Although my prior U.S. Pat. No. 4,569,073 discloses that asymmetrical sideband transmissions can be generated using an independent sideband (ISB) AM stereo exciter of the type covered by my prior U.S. Pat. Nos. 3,908,090 and 4,373,115, it notes that when an asymmetrical sideband transmission is received on an ISB AM stereo receiver, such as the type disclosed in my prior U.S. Pat. No. 4,018,994, the stereo image will be inherently shifted to one side by the intentional asymmetry of the sidebands, as will be clearly understood by those skilled in the art. My U.S. Pat. No. 4,569,073 notes that if only a small amount of asymmetry is used, it might be compensated for in an ISB AM stereo receiver by adjusting the "balance" control of the receiver so as to shift the reproduced stereo image back to its normal position. However, my U.S. Pat. No. 4,569,073 discloses that asymmetrical sideband transmission is otherwise primarily useful for broadcasting monophonic program material.

It is, therefore, an object of the present invention to provide an improved asymmetrical sideband AM transmission system wherein the transmitted signal will produce a pleasing pseudo-stereo effect when received by a stereo receiver of the type designed to receive symmetrical sideband, phase-separated AM stereo radio broadcasts, when such receiver is operating in its stereo mode.

SUMMARY OF THE INVENTION

In accordance with the present invention, there is provided an improved asymmetrical sideband AM transmitter which includes means, responsive to at least one supplied audio program signal, for developing an amplitude modulated (AM) radio frequency (RF) carrier signal having intentionally asymmetrical sidebands. The transmitter also includes means for causing the AM asymmetrical sideband RF carrier signal to include an AM stereo pilot signal component corresponding to a selected symmetrical sideband, phase-separated AM stereo system, thereby producing a composite signal. Finally, the transmitter includes means for transmitting the composite signal.

In accordance with another aspect of the present invention there is provided a method of producing an improved asymmetrical sideband, AM broadcast signal which includes the step of developing an asymmetrical sieband AM broadcast signal. The method also includes the further step of adding to the signal an AM stereo pilot signal component corresponding to a selected symmetrical sideband, phase-separated AM stereo system.

For a better understanding of the present invention, together with other and further objects thereof, reference is made to the following description, taken in conjunction with the accompanying drawings, and its scope will be pointed out in the appended claims.

DETAILED DESCRIPTION OF THE INVENTION

Figure 1:
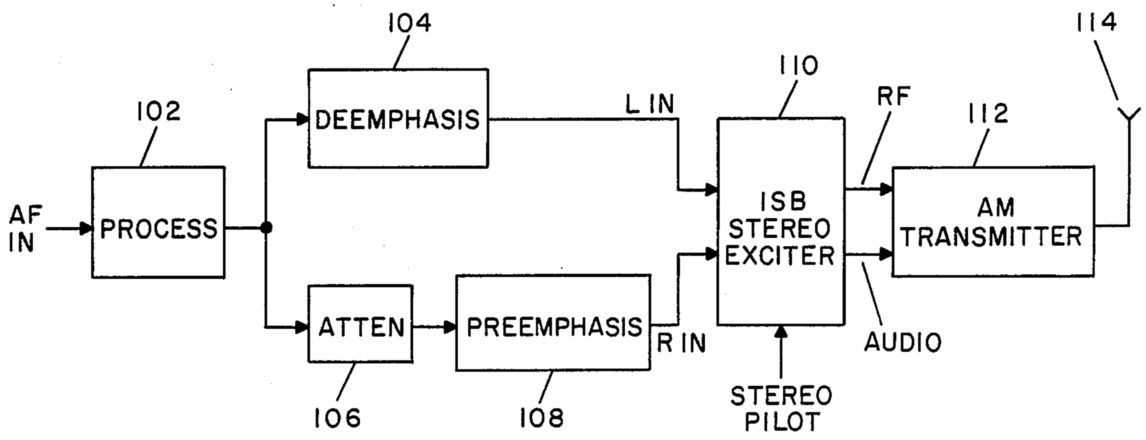
FIG. 1 is a block diagram of an improved asymmetrical sideband AM transmitter embodying the present invention.

FIG. 1 illustrates an improved asymmetrical sideband AM transmitter which embodies the present invention and corresponds with FIG. 1 of my prior U.S. Pat. No. 4,569,073 except for the ISB stereo exciter unit 110'. Furthermore, the only difference in ISB stereo exciter 110' is that it adds to the transmitted signal a stereo pilot signal component of a selected low audio frequency, as will be described more fully.

In the embodiment of FIG. 1, an audio frequency monophonic program signal, such as music or a newscast for example, is supplied to a conventional broadcast audio processor 102, which preemphasizes the higher frequency audio components. The output of unit 102 is split and feeds two signal processing channels which, in turn, feed the left stereo channel input ("L IN") and right stereo channel input ("R IN") of ISB stereo exciter 110'. In the embodiment shown in FIG. 1 the signal processing channel which feeds the L IN of exciter 110' includes de-emphasis network 104, while the other audio processing channel which feeds the R IN of exciter 110' includes the series combination of aattenuator 106 and pre-emphasis network 108. This arrangement results in an asymmetrical sideband transmission wherein the lower sideband is higher in level than the upper sideband. By simply exchanging the components in the two audio processing channels, so that unit 104 feeds the R IN of exciter 110' and the combination of units 106/108 feeds the L IN of exciter 110' the upper sideband of the transmitted signal could be made higher in level than the lower sideband.

The two outputs of exciter 110', which are a phase-modulated RF carrier signal and an audio frequency signal, are fed to conventional AM transmitter 112, where the audio signal amplitude modulates the phase-modulated RF carrier, thereby generating an RF signal having asymmetrical sidebands. This resulting signal is then coupled to transmitting antenna 114.

As noted above, when an asymmetrical sideband signal is received by an ISB AM stereo receiver operating in its stereo mode, the stereo image is inherently shifted to one side (the side corresponding to the higher level sideband). However, it has been discovered that when an asymmetrical sideband transmission is received by a stereo receiver designed for receiving symmetrical sideband, phase-separated AM stereo broadcast signals and operating in its stereo mode, it produces a pleasing pseudo-stereo sound. But, a receiver of this type normally does not operate in its stereo mode unless it is receiving a stereo broadcast which contains a particular stereo pilot signal component. In the AM broadcast band, a stereo pilot signal component is a low audio frequency signal that identifies the received signal as a stereo signal and also identifies the system used to generate the stereo signal at the transmitter, as is well known in the art. For example, the pilot signal frequency associated with ISB AM stereo system broadcasts is 15 Hz, whereas the pilot signal frequency associated with Motorola AM stereo system broadcasts is 25 Hz.

Thus, in accordance with the present invention, a stereo pilot signal component is added to the transmitted signal by ISB stereo exciter 110' in FIG. 1. However, a conventional ISB stereo exciter, such as unit 110 shown in my prior U.S. Pat. No. 4,569,073 and in greater detail in my prior U.S. Pat. Nos. 3,908,090 and 4,373,115 mentioned above, normally adds a pilot signal component whose frequency is 15 Hz, since this is the frequency assigned to the Kahn/Hazeltine ISB AM stereo system. Thus, ISB stereo exciter 110' shown in FIG. 1 instead adds a pilot signal component whose frequency corresponds to a selected symmetrical sideband, phase-separated AM stereo system, such as the Motorola system which uses a 25 Hz pilot frequency.

The addition of a 25 Hz pilot component to the asymmetrical sideband transmission produced by the embodiment of FIG. 1 causes AM stereo receivers designed for the Motorola AM stereo system to operate in their stereo mode when receiving the asymmetrical sideband transmission. When they do, the result is a pleasing pseudo-stereo sound, even though the input program signal to the embodiment of FIG. 1 is a monophonic signal. Thus, not only are the benefits of asymmetrical sideband transmission obtained, but in addition, the same transmission will produce a pleasing pseudo-stereo effect when received by AM stereo receivers designed for the Motorola AM stereo system. If it is desired to produce this effect in AM stereo receivers designed for one of the other symmetrical sideband, phase-separated AM stereo systems, such as the Magnavox system for example, it is only necessary to change the stereo pilot frequency to that which corresponds to the desired AM stereo system. In the case of the Magnavox system, this would be 5 Hz.

Figure 2:
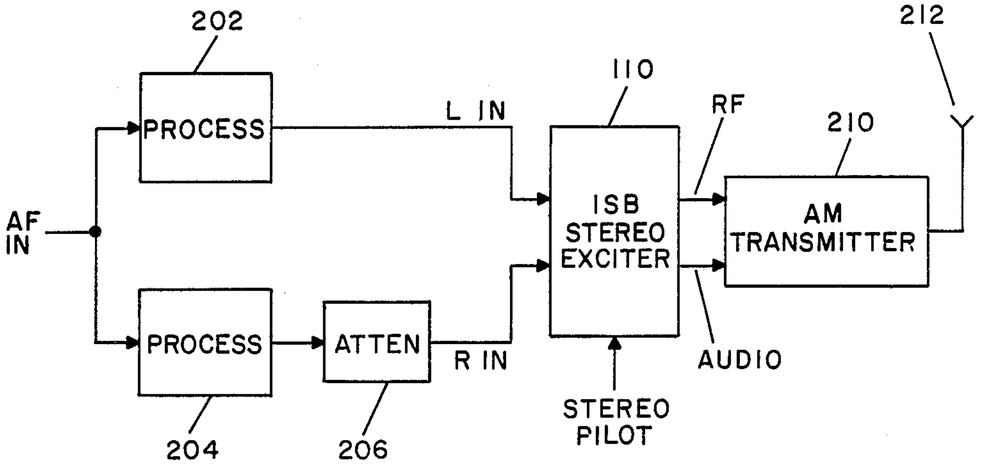
FIG. 2 is a block diagram of another embodiment of the present invention.

The embodiment shown in FIG. 2 corresponds to FIG. 2 of my prior U.S. Pat. No. 4,569,073 except that the ISB stereo exciter 110' is the same as that used in FIG. 1 of this application. That is, it adds to the asymmetrical sideband signal a pilot signal component having a low audio frequency corresponding to a selected symmetrical sideband, phase-separated AM stereo system, such as 25 Hz in the case of the Motorola system. Otherwise the description and operation of the embodiment of FIG. 2 is the same as that for FIG. 2 of my prior U.S. Pat. No. 4,569,073 and will be well understood by those skilled in the art.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An improved asymmetrical sideband, amplitude modulation transmitter, comprising:

means, responsive to at least one supplied audio program signal, for developing an amplitude-modulated (AM) radio frequency (RF) carrier signal having intentionally asymmetrical sidebands;

means for causing said AM asymmetrical sideband RF carrier to include an AM stereo pilot signal component corresponding to a selected symmetrical sideband, phase-separated AM stereo system, thereby producing a composite signal; and means for transmitting said composite signal.

2. An improved transmitter in accordance with claim 1 wherein said stereo pilot signal component is a low audio frequency tone.

3. An improved transmitter in accordance with claim 2 wherein the frequency of said stereo pilot signal component is 25 Hz.

4. The method of producing an improved asymmetrical sideband, amplitude modulated (AM) broadcast signal, comprising the steps of:

developing an asymmetrical sideband AM broadcast signal; and in the process of doing so, adding to it an AM stereo pilot signal component corresponding to a selected symmetrical sideband, phase-separated AM stereo system.

5. The method of claim 4 wherein said stereo pilot signal component is a low audio frequency tone.

6. The method of claim 5 wherein the frequency of said stereo pilot signal component is 25 Hz.

* * * * *